(12) United States Patent
Shima et al.

(10) Patent No.: US 12,232,436 B2
(45) Date of Patent: Feb. 18, 2025

(54) INFORMATION PROCESSING DEVICE AND METHOD OF DRIVING INFORMATION PROCESSING DEVICE

(71) Applicant: NATIONAL INSTITUTE OF ADVANCED INDUSTRIAL SCIENCE AND TECHNOLOGY, Tokyo (JP)

(72) Inventors: Hisashi Shima, Tsukuba (JP); Yasuhisa Naitoh, Tsukuba (JP); Hiroyuki Akinaga, Tsukuba (JP); Makoto Takahashi, Tsukuba (JP)

(73) Assignee: NATIONAL INSTITUTE OF ADVANCED INDUSTRIAL SCIENCE AND TECHNOLOGY, Kyoto (JP)

( * ) Notice: Subject to any disclaimer, the term of this patent is extended or adjusted under 35 U.S.C. 154(b) by 183 days.

(21) Appl. No.: 17/896,213

(22) Filed: Aug. 26, 2022

(65) Prior Publication Data

US 2022/0407003 A1    Dec. 22, 2022

Related U.S. Application Data

(63) Continuation of application No. PCT/JP2021/006485, filed on Feb. 19, 2021.

(30) Foreign Application Priority Data

Feb. 27, 2020 (JP) ................ 2020-032407

(51) Int. Cl.
G11C 11/00 (2006.01)
G06N 3/065 (2023.01)
(Continued)

(52) U.S. Cl.
CPC ......... *H10N 70/8833* (2023.02); *G06N 3/065* (2023.01); *G11C 13/0007* (2013.01);
(Continued)

(58) Field of Classification Search
CPC ............. H10N 70/8833; H10N 70/826; H10N 70/841; H10B 63/22; G06N 3/065; G11C 13/0007; G11C 2213/32; G11C 2213/55
(Continued)

(56) References Cited

U.S. PATENT DOCUMENTS 8,531,862 B2    9/2013  Roest
8,673,203 B2 *  3/2014  Clark ............... B23K 26/342
                                                        264/497
(Continued)

FOREIGN PATENT DOCUMENTS

EP          0775932 B1    8/2001
JP       2007293969 A    11/2007
(Continued)

OTHER PUBLICATIONS

Japanese Office Action dated Aug. 22, 2023, in the counterpart Japanese Patent Application No. 2020-032407.
(Continued)

*Primary Examiner* — Viet Q Nguyen
(74) *Attorney, Agent, or Firm* — Rabin & Berdo, P.C.

(57) ABSTRACT

An information processing device, including a resistive analog neuromorphic device element having a pair of electrodes and an oxide layer provided between the pair of electrodes, and a parallel circuit having a low resistance component and a capacitance component. The parallel circuit and the resistive analog neuromorphic device element are connected in series.

6 Claims, 18 Drawing Sheets

(51) Int. Cl.
*G11C 13/00* (2006.01)
*H10B 63/00* (2023.01)
*H10N 70/00* (2023.01)

(52) U.S. Cl.
CPC .......... *H10B 63/22* (2023.02); *H10N 70/826* (2023.02); *H10N 70/841* (2023.02); *G11C 2213/32* (2013.01); *G11C 2213/55* (2013.01)

(58) Field of Classification Search
USPC ........................................................ 365/148
See application file for complete search history.

(56) References Cited

U.S. PATENT DOCUMENTS

| | | | |
|---|---|---|---|
| 9,269,903 B2 | 2/2016 | Nishioka | |
| 9,864,950 B2* | 1/2018 | Datta | G06N 3/063 |
| 10,392,243 B2* | 8/2019 | Almeida Loya | G01P 15/125 |
| 10,403,816 B2* | 9/2019 | Reid | H10N 70/023 |
| 10,658,587 B2* | 5/2020 | Reid | H10N 70/041 |
| 10,861,545 B2* | 12/2020 | Dalgaty | G06N 3/049 |
| 11,068,777 B2* | 7/2021 | Bedell | G06N 3/065 |
| 11,551,749 B2* | 1/2023 | Bibes | H01L 29/516 |
| 11,586,884 B2* | 2/2023 | Yang | G06N 3/065 |
| 11,625,590 B2* | 4/2023 | Cho | G06N 3/065 706/41 |
| 11,636,316 B2* | 4/2023 | Shifren | G06N 3/048 706/27 |
| 11,861,488 B1* | 1/2024 | Yi | G06N 3/049 |
| 2010/0276684 A1 | 11/2010 | Shima et al. | |
| 2011/0051500 A1 | 3/2011 | Takagi et al. | |
| 2014/0146594 A1 | 5/2014 | Hayakawa et al. | |
| 2018/0076386 A1 | 3/2018 | Reid et al. | |
| 2018/0082168 A1 | 3/2018 | Marukame et al. | |
| 2019/0229770 A1* | 7/2019 | Gangadharrao et al. | A61N 1/02 365/148 |
| 2019/0244088 A1 | 8/2019 | Yang et al. | |
| 2021/0349693 A1* | 11/2021 | Ito | G06F 7/5443 |
| 2022/0130900 A1* | 4/2022 | Terasaki | H10B 99/00 |
| 2022/0261559 A1* | 8/2022 | Shibata | H10N 70/00 |

FOREIGN PATENT DOCUMENTS

| | | |
|---|---|---|
| JP | 2009135461 A | 6/2009 |
| JP | 2018049887 A | 3/2018 |
| TW | 201242232 A | 10/2012 |
| TW | 201619680 A | 6/2016 |
| TW | 201721856 A | 6/2017 |
| WO | 2010064446 A1 | 6/2010 |
| WO | 2012169194 A1 | 12/2012 |
| WO | 2016153515 A1 | 9/2016 |

OTHER PUBLICATIONS

Hisashi Shima et al., "Electrode Material Dependence of Resistance Change Behavior in Ta2O5 Resistive Analog Neuromorphic Device", IEEE Journal of the Electron Devices Society, Oct. 17, 2018, vol. 6, pp. 1220-1226.
International Search Report for PCT/JP2021/006485, mailed on May 25, 2021.
Written Opinion of the International Searching Authority for PCT/JP2021/006485, mailed on May 25, 2021.
Zhongrui Wang, 23 others, "Capacitive neural network with neuro-transistors", [online], Aug. 10, 2018, nature communications, [searched on Feb. 6, 2020], Internet.
Taiwanese Office Action issued on Sep. 28, 2021, for the corresponding Taiwan patent application No. 110106641.
Chinese Office Action dated Oct. 31, 2024, in the counterpart Chinese Patent Application No. 202180017574.8.

* cited by examiner

INFORMATION PROCESSING DEVICE AND METHOD OF DRIVING INFORMATION PROCESSING DEVICE

CROSS REFERENCE TO RELATED APPLICATIONS

This is a continuation application of International Application PCT/JP2021/006485 filed on Feb. 19, 2021 which claims priority from a Japanese Patent Application No. 2020-032407 filed on Feb. 27, 2020, the contents of which are incorporated herein by reference.

BACKGROUND OF THE INVENTION

1. Field of the Invention

Embodiments of the invention relate to an information processing device and a method of driving an information processing device; and particularly relate to a neuromorphic information processing device that uses a resistive analog neuromorphic device element and a method of driving the neuromorphic information processing device.

2. Description of the Related Art

Internet of Things (IoT) technology has come to be applied to various fields and the amount of data flowing into the Internet is increasing at an accelerating pace. As a result, power consumption is increasing for all processes such as information collection and storage, distribution, analysis, and control.

In an instance in which a central processing unit (CPU) accesses memory and performs arithmetic processing like a conventional computer, the rate of data transfer is slow and therefore, increases in power consumption cannot be suppressed. With recent neurocomputers (neuromorphic information processing devices, neuromorphic circuits), super-parallel computation is enabled by in-memory computing in which the processor and memory are integrated, and by mimicking information processing within the brain, the efficiency of computation is high and power consumption may be reduced.

By neuromorphic information processing, for example, neurons are modeled as multiple-input/single-output elements and input patterns are separated on a separation plane by perceptron pattern identification. In the neuromorphic information processing device, for example, a resistive analog neuromorphic device element is used for perceptron and an array structure connected to a crossbar by word lines and bit lines is used. The resistive analog neuromorphic device element is also called a memristor or a resistive analog neuro device (RAND).

The resistive analog neuromorphic device element has a resistive switch effect in which a current value changes non-linearly when voltage is applied to an insulating oxide coating, and the resistance value varies in an analog-manner due to a redox reaction induced by the current. The resistive analog neuromorphic device element has an I (current)-V (voltage) curve that exhibits hysteresis characteristics and therefore, nonvolatile resistance changes may be used as memory.

As a technique related to a resistive analog neuromorphic device element, for example, a rectifier element in which a titanium layer is interposed between electrodes has been disclosed, the rectifier element being capable of reversing rectifier characteristics by applying, in an opposite direction between the electrodes, an inverted electrical signal of a magnitude that exceeds a critical reversal power (for example, refer to Japanese Laid-Open Patent Publication No. 2009-135461).

Further, a technique has been disclosed that temporally controls electrical conductivity and reduces circuit power consumption, by a non-volatile pseudo-memcapacitor (NPM) in which a series capacitor Cs is connected to a memristor-specific parallel capacitor Cp (for example, refer to Zhongrui Wang, et al, "Capacitive neural network with neuro-transistors", [online], Aug. 10, 2018, Nature Communications, [searched Feb. 6, 2020], Internet<URL:https://www.nature.com/articles/s41467-018-05677-5>).

Further, a technique has been disclosed that enhances arithmetic processing speeds and rewriting frequency, by a memcapacitor having an upper electrode and in which multiple second dielectric layers and multiple variable resistance units are alternately disposed in a vertical shape on a first dielectric layer on a lower electrode (for example, refer to Japanese Laid-Open Patent Publication No. 2018-49887).

SUMMARY OF THE INVENTION

According to an embodiment, an information processing device includes a resistive analog neuromorphic device element having: a pair of electrodes, and an oxide layer provided between the pair of electrodes; and a parallel circuit having: a low resistance component, and a capacitance component. The parallel circuit and the resistive analog neuromorphic device element are connected in series.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
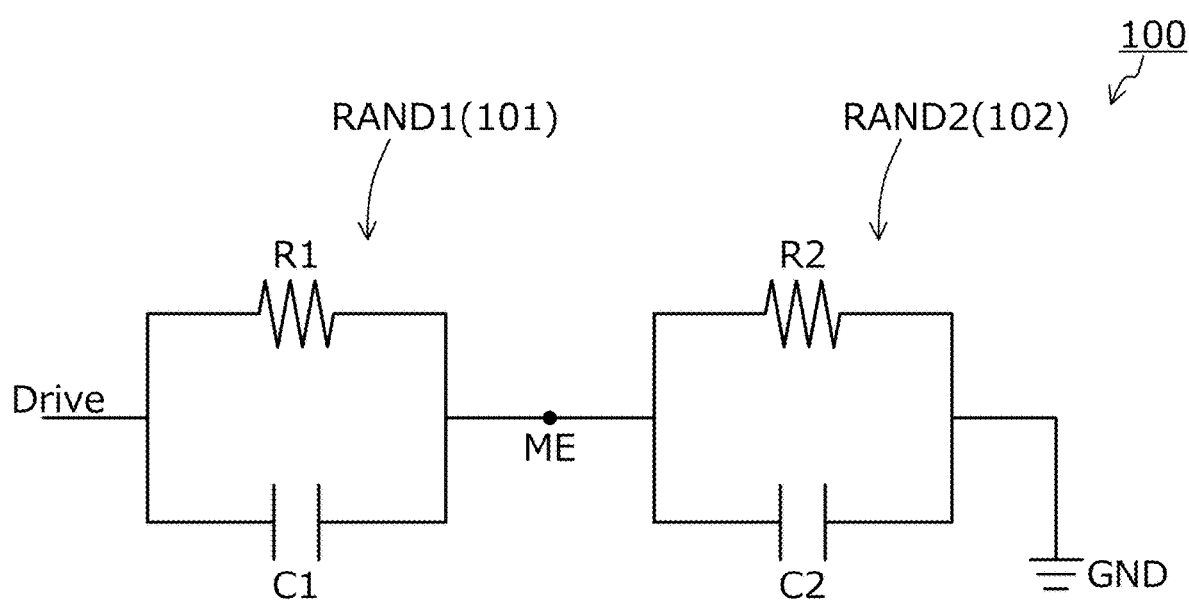
FIG. 1 is an equivalent circuit diagram of an information processing device according to an embodiment.

First, problems associated with the conventional techniques are discussed. Regarding the techniques disclosed in Japanese Laid-Open Patent Publication No. 2009-135461 and by Zhongrui Wang, et al, in the DC I-V curve, sudden resistance changes occur in a resistance lowering (Set) process as compared to a resistance increasing (Reset) process. In particular, in the process of lowering resistance, sudden (digital) resistance changes occur on the hysteresis characteristics. This is presumed to be a result of a large portion of the voltage being continuously applied to an element having a high resistance, whereby the lowering of the resistance proceeds rapidly and obtaining a desired arbitrary resistance value is difficult.

Further, the technique disclosed in Japanese Laid-Open Patent Publication No. 2018-49887 employs a structure in which in a direction within a plane (different position when viewed in a plane view) of the device element, the multiple second dielectric layers and the multiple variable resistance units are alternately disposed apart from one another and therefore, the size in the vertical direction cannot be reduced, whereby miniaturization (size reductions) of the device element and 3-dimensional structuring of the device element with respect to vertical, horizontal, and height directions are difficult.

Conventionally, a method of using a current compliance function of a measuring instrument or a method of using transistors to control the amount of current by gate voltage may be used to obtain an arbitrary resistance value on sudden resistance-change characteristics. Nonetheless, with the method of using the current compliance function, the measuring instrument is used constantly and thus, is not practical. Further, with the method of using transistors, in instances in which the transistors are disposed 2-dimensionally and in instances in which the transistors are disposed 3-dimensionally, additional space for the transistors is necessary, processes become complex, and cost increases and thus, adoption of such methods is undesirable.

It is desirable for the resistive analog neuromorphic device element used in a neuromorphic information processing device to have a means of suppressing sudden resistance changes in the resistance lowering (Set) process. As for the resistive analog neuromorphic device element, with the suppression of sudden resistance-change characteristics in the resistance lowering (Set) process, resistance changes become smooth by the removal of resistance change component noise and reduced power consumption and a high speed of a sum of products circuit may be expected.

Further, at present, due to sudden resistance changes occurring in the resistance lowering (Set) process, resistance-change characteristics in the resistance lowering (Set) process and resistance-change characteristics in the resistance increasing (Reset) process are asymmetrical. In an instance in which a resistive analog neuromorphic device element is used in a sum of products circuit (artificial intelligence, deep learning, inference, machine learning, etc.) of a neuromorphic information processing device, if the resistance-change characteristics in the resistance lowering (Set) process and the resistance-change characteristics in the resistance increasing (Reset) process can be made symmetrical, enhanced symmetry of the memory operation and the forgetting operation of a sum of products circuit may be expected.

FIG. 1 is an equivalent circuit diagram of an information processing device according to an embodiment. The information processing device of the embodiment includes a resistive analog neuromorphic device element 100 (RAND, memcapacitor device element) of the neuromorphic information processing device described above and has a configuration in which, for example, two RANDs (RAND1, RAND2) having the same structure are connected in series via a junction point ME.

Additionally, configuration may be such that a parallel circuit that has a low resistance component and a capacitance component is connected directly to an analog resistive device element in which a low resistance component and a capacitance component are connected in parallel. In other words, configuration may be such that a resistive analog neuromorphic device element constituted by a pair of electrodes and an oxide layer provided between the pair of electrodes and a parallel circuit having a low resistance component and a capacitance component are connected in series. Further, as the parallel circuit, a resistive analog neuromorphic device element having a capacitance component may be used and configuration may be such that a pair of resistive analog neuromorphic device elements are connected in series.

In the configuration example depicted in FIG. 1, RAND1 has a feature in that a low resistance component R1 and a capacitance component C1 are connected in parallel. RAND2 also has a feature in that a low resistance component R2 and a capacitance component C2 are connected in parallel.

A RAND (RAND1+RAND2) 100 of the embodiment connects, in parallel, RAND1 (101) and RAND2 (102) that each have the same structure. The RAND 100 having this structure reduces the voltage applied to the RAND and suppresses sudden resistance-change characteristics, by the process of lowering resistance (Set) described above.

As for the RAND 100 configured as depicted in FIG. 1, while in a state in which no change in resistance has occurred, the voltage is distributed according to a ratio of the low resistance component R1 to the low resistance component R2; however, during a rapid change in resistance, the effect of the capacitance components C1, C2 appears and the voltage becomes distributed according to the ratio of capacitances. While described in detail hereinafter, in an instance in which a change in the resistance is slow, the ratio of the voltage distributed to RAND1 and RAND2 is V1:V2=R1:R2 while in an instance in which a change in the resistance is rapid, the ratio is V1:V2=1/C1:1/C2.

For example, RAND1, due to an application of voltage, functions as device element for which the resistance value changes and RAND2 functions as a capacitor.

As a result, normally, while a large portion of the voltage is distributed to the device element of a high resistance state, when the resistance decreases rapidly, the voltage decreases and sudden decreases in the resistance may be suppressed. Further, by such suppression of sudden decreases in the resistance when the resistance decreases, it becomes possible to make the resistance-change characteristics in the resistance lowering (Set) process symmetrical with the resistance-change characteristics in the resistance increasing (Reset) process.

Figure 2:
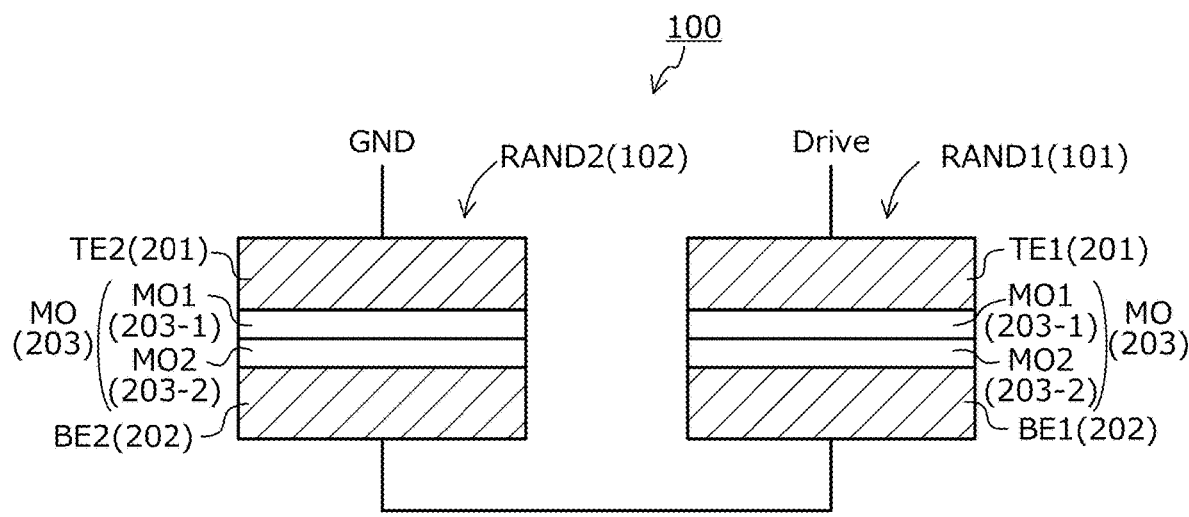
FIG. 2 is a diagram depicting an example of a structure of each RAND according to the embodiment.
Figure 3:
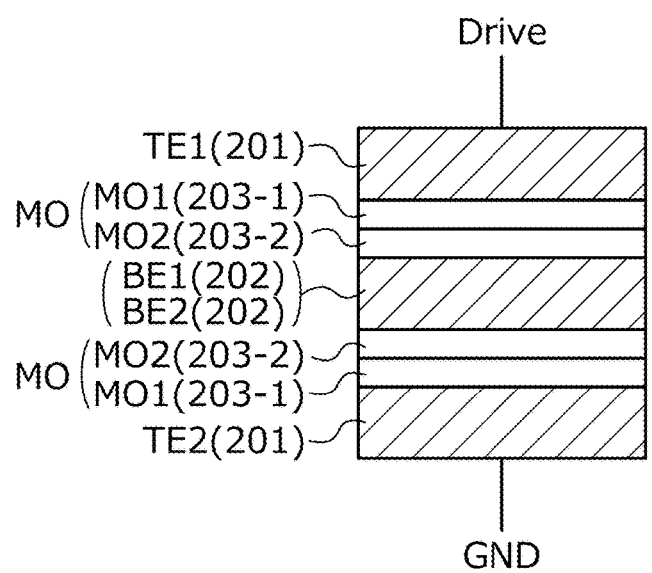
FIG. 3 is a diagram depicting an example of the structure of each RAND according to the embodiment.

FIGS. 2 and 3 are diagrams depicting examples of the structure of each RAND according to the embodiment. RAND1 (101) and RAND2 (102) are each constituted by a structure in which an insulating oxide layer is sandwiched by (intervenes) electrodes.

In the example depicted in FIG. 2, for example, an upper electrode (TE) 201 and a lower electrode (BE) 202 each contain titanium nitride (TiN), and an oxide layer (MO) 203 contains tantalum oxide (TaOx).

The oxide layer (MO) 203 has at least one layer. In the FIG. 2, the MO 203 is configured by two layers including an MO1 (the TaOx-L) 203-1 and an MO2 (the TaOx-H) 203-2. The TaOx-L and the TaOx-H are Ta oxide films with different resistivities, where the resistivities satisfy the TaOx-L<the TaOx-H.

The oxide layer (MO) 203 is constituted by multiple resistivity layers, whereby it becomes possible to obtain more desirable resistance-change characteristics. One RAND (one portion of the oxide layer MO 203) has a device element size of 100 nm.

Resistance changes occurring in one RAND, for example, RAND1 (101) are based on a redox reaction induced by current. Conductance of the RAND increases by the process of lowering resistance (Set) and decreases with the process of increasing resistance (Reset).

For example, when positive voltage is applied to the lower electrode (BE) 202, oxygen ions move in the oxide layer MO 203 and oxidation progresses, whereby a high resistance layer is formed and conductance increases in an entire area of one RAND (101).

In the embodiment, as depicted in FIG. 2, the two lower electrodes (BE) 202 respectively of RAND1 (101) and RAND2 (102) are connected by wiring or the like. Further, voltage (Drive) is applied to an upper electrode (TE1) 201 of RAND1 (101) and an upper electrode (TE2) 201 of RAND2 (102) is grounded (GND). Hereinafter, a circuit system in which the two RANDs, RAND1 (101) and RAND2 (102), are connected directly to each other is indicated as "RAND1+RAND2".

Such a circuit system as RAND1+RAND2 may be structured as depicted in FIG. 3. The structure example depicted in FIG. 3 corresponds to a case in which RAND1 (101) is formed stacked on RAND2 (102) depicted in FIG. 2. In the structure depicted in FIG. 3, the lower electrode (BE1) 202 of RAND1 (101) depicted in FIG. 2 and the lower electrode (BE2) 202 of RAND2 (102) are shared by a single electrode.

Here, the stacked structure depicted in FIG. 3 is described using the reference characters shown in FIG. 2. Sequentially from the lowermost, the upper electrode (TE2) 201 of RAND2 (102), the oxide layer (MO) 203 (MO1 (203-1), MO2 (203-2)), the lower electrode (BE2) of RAND2 (102) (corresponds to the lower electrode (BE1) 202 of RAND1 (101)), the oxide layer (MO) 203 (MO2 (203-2), MO1 (203-1)) of RAND1 (101), and the upper electrode (TE1) 201 of RAND1 (101) are stacked.

The structure depicted in FIG. 2 enables a configuration in which an existing RAND arrangement is used, and for RAND1+RAND2, the lower electrodes (BE1) 202, BE2 (202) of RAND1 and RAND2 are merely connected by a wiring member or wiring pattern. Further, the structure depicted in FIG. 3 enables formation of the RAND1+RAND2 (100) structure in the space of a single RAND and installation in about one half of the space as compared to FIG. 2.

Next, results of various types of evaluation of electrical characteristics of the resistive analog neuromorphic device element 100 (RAND1+RAND2) according to the embodiment, obtained using a semiconductor parameter analyzer are discussed.

Figure 4A:
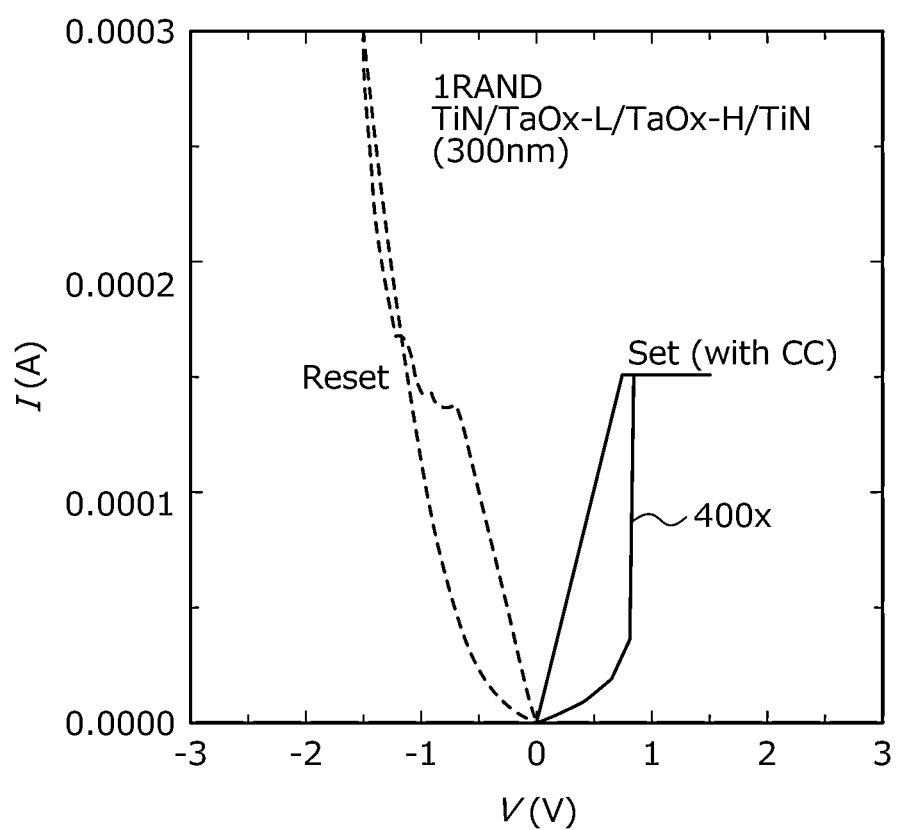
FIG. 4A is a figure for explaining I-V characteristics of RAND1+RAND2 according to the embodiment.
Figure 4B:
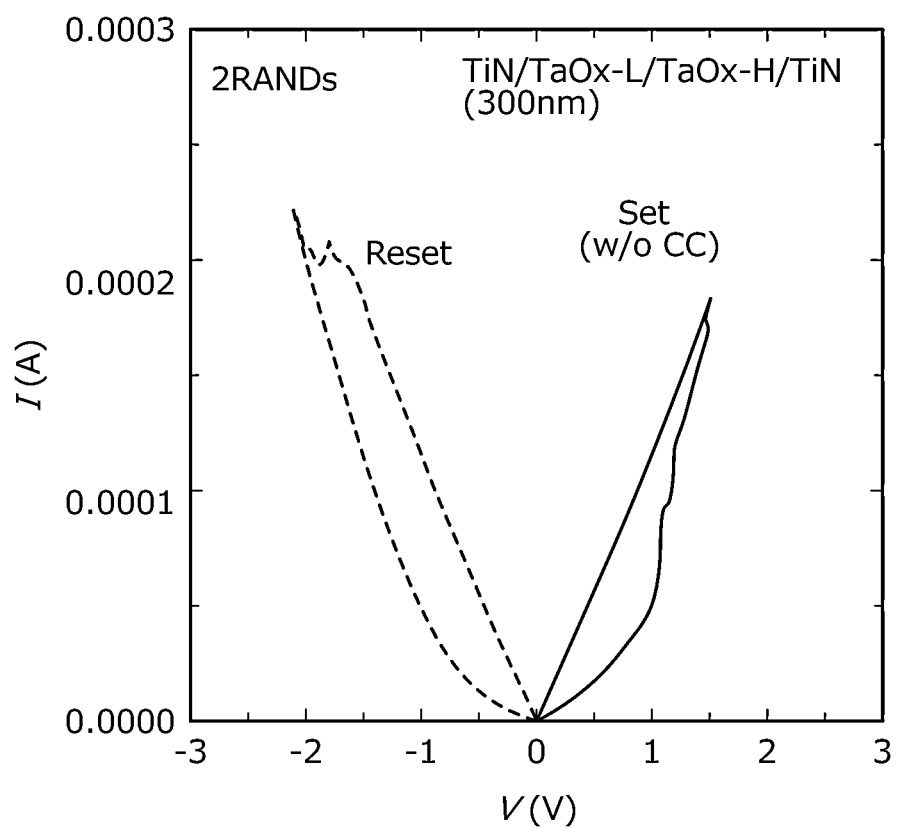
FIG. 4B is a figure for explaining I-V characteristics of RAND1+RAND2 according to the embodiment.

FIGS. 4A and 4B are figures for explaining I-V characteristics of RAND1+RAND2 according to the embodiment. FIG. 4B depicts the I-V characteristics of RAND1+RAND2 according to the embodiment and for contrast, FIG. 4A depicts I-V characteristics of one (RAND1) of the RANDS. In the figures, a horizontal axis indicates voltage V while a vertical axis indicates current I.

As depicted in FIG. 4A, in an instance of RAND1 alone, for example, the electrodes TE, BE contain TiN and thus, in the Reset process indicated in the figures by dashed lines, a sudden increase in the resistance may be suppressed. Nonetheless, in the Set process indicated by solid lines in the figures, a sudden increase in resistance (portion indicated by reference character 400x) occurs. In the example depicted in FIG. 4A, in a vertical direction in the figure, is a sudden increase in the resistance occurs near +1V. To suppress this sudden increase in the resistance, a need to control the resistance value by using a current limit (current compliance (CC)) arises. Conventionally, for example, as described above, CC is performed using separate measuring instruments and transistors.

In contrast, in an instance of RAND1+RAND2 as in the embodiment, as depicted in FIG. 4B, the resistance changes slowly in the Set process and the range of the voltage to be applied is adjusted, whereby the resistance may be lowered without using CC.

Figure 5:
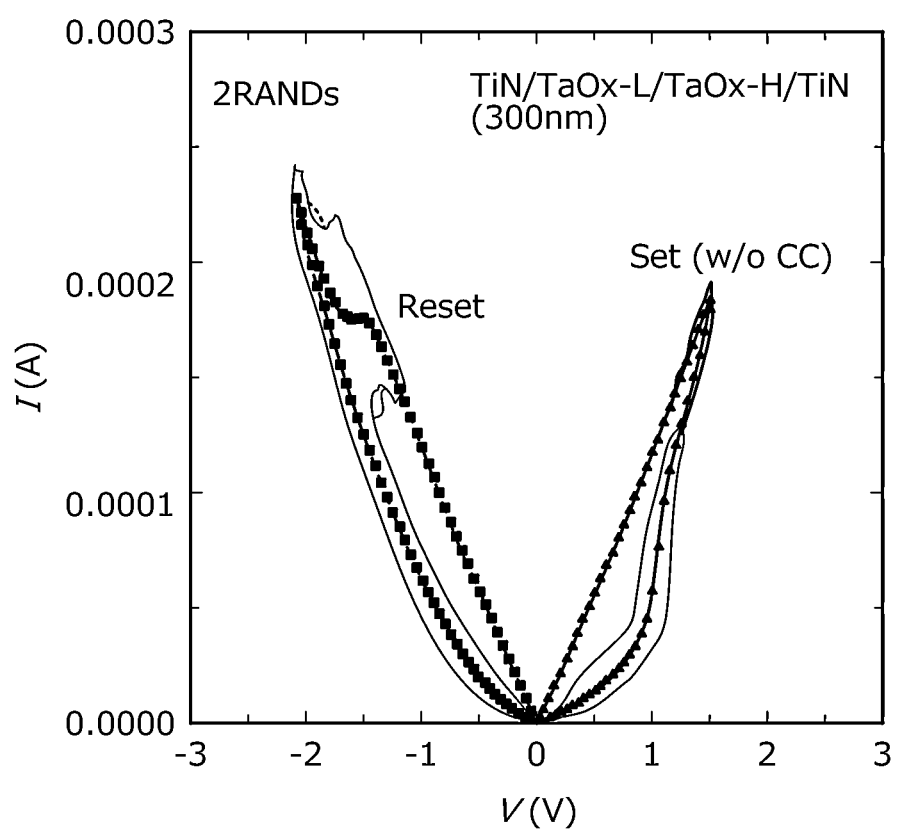
FIG. 5 is a diagram depicting I-V characteristics when RAND1+RAND2 according to the embodiment is repeatedly measured.

FIG. 5 is a diagram depicting the I-V characteristics when RAND1+RAND2 according to the embodiment is repeatedly measured. Results are shown for a state in which Set and Reset are each performed for 100 cycles with respect to RAND1+RAND2. During the repeated driving depicted in FIG. 5, while there is variation in the characteristics on the voltage V direction in the Set process and in the Reset process depicted in FIG. 4B, characteristics about the same as the hysteresis characteristics of Set and Reset depicted in FIG. 4B are indicated. In other words, even during repeated driving, a state is indicated in which the resistance changes slowly in the Set process similarly to that in FIG. 4B.

Figure 6A:
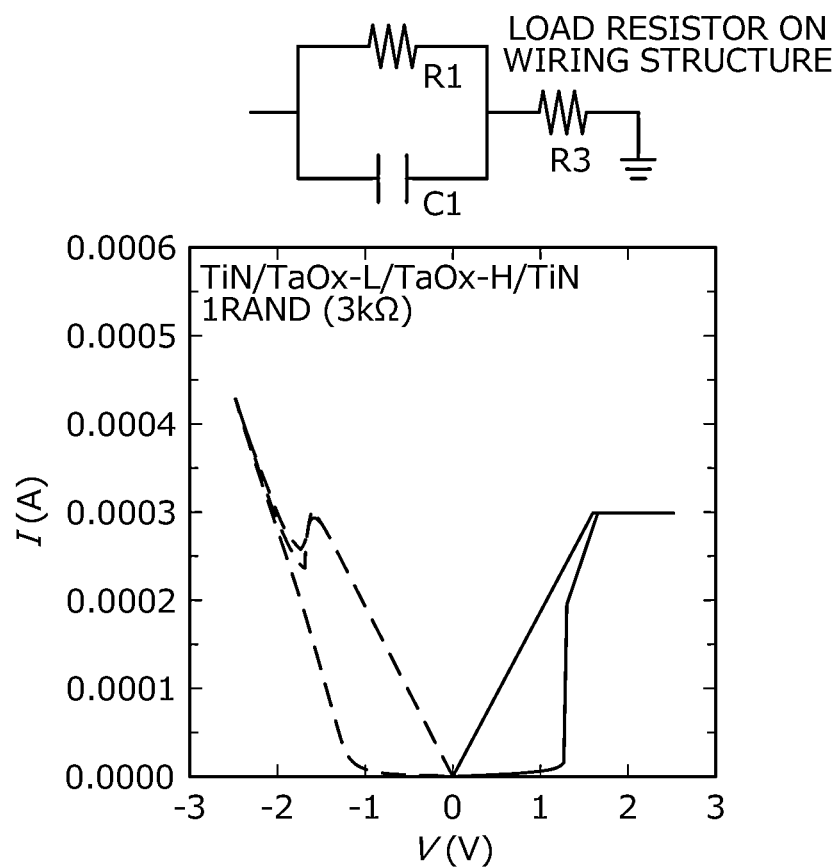
FIG. 6A is a figure showing the I-V characteristics of RAND1+RAND2 according to the embodiment.
Figure 6B:
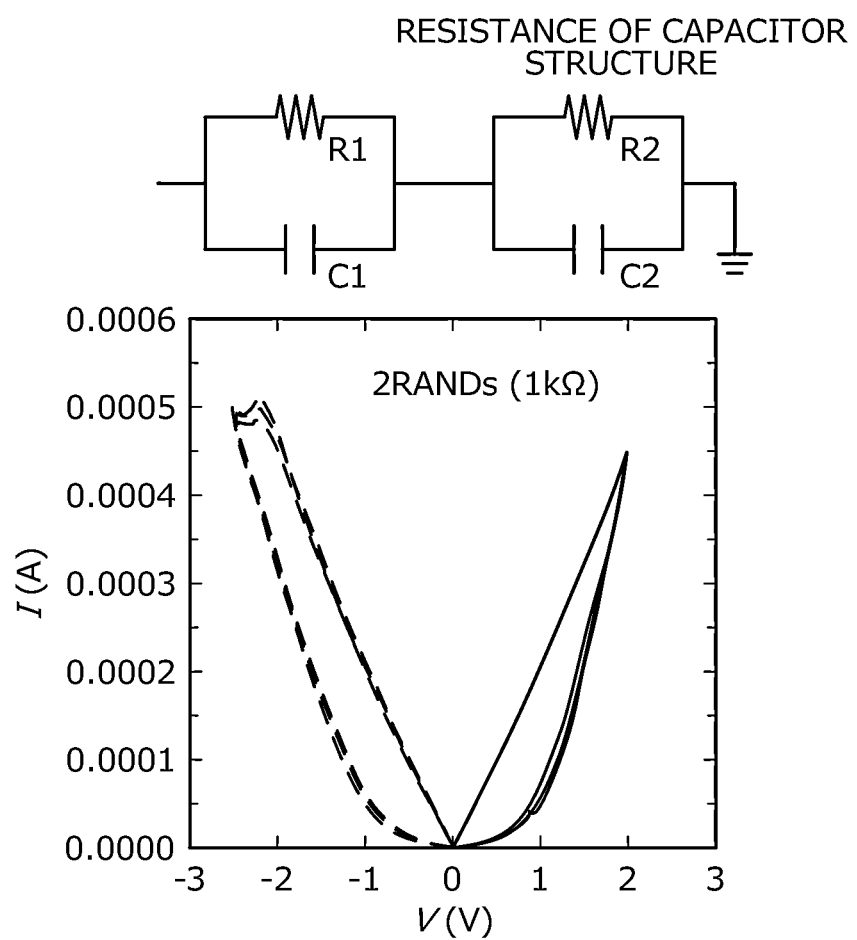
FIG. 6B is a figure showing the I-V characteristics of RAND1+RAND2 according to the embodiment.

FIGS. 6A and 6B are figures showing the I-V characteristics of RAND1+RAND2 according to the embodiment. FIG. 6A depicts, for contrast, I-V characteristics in an instance in which a load resistance R3 (3 kΩ) on a wiring structure is connected in series to a single (RAND1) RAND. FIG. 6B depicts the I-V characteristics of RAND1+RAND2 according to the embodiment, where the low resistance component R2 is 1 kΩ. In FIGS. 6A and 6B, similarly as described above, the Reset process is indicated by dashed lines while the Set process is indicated by solid lines.

As depicted in FIG. 6A, it is found that in the instance in which a resistor connected in series to the one RAND1 is the load resistance R3 on the wiring structure, a sudden increase in the resistance in the Set process cannot be suppressed. In contrast, as depicted in FIG. 6B, it is found that the resistance of a capacitor structure of the RAND2 portion is connected to RAND1, whereby a sudden increase in the resistance in the Set process may be suppressed.

Figure 7A:
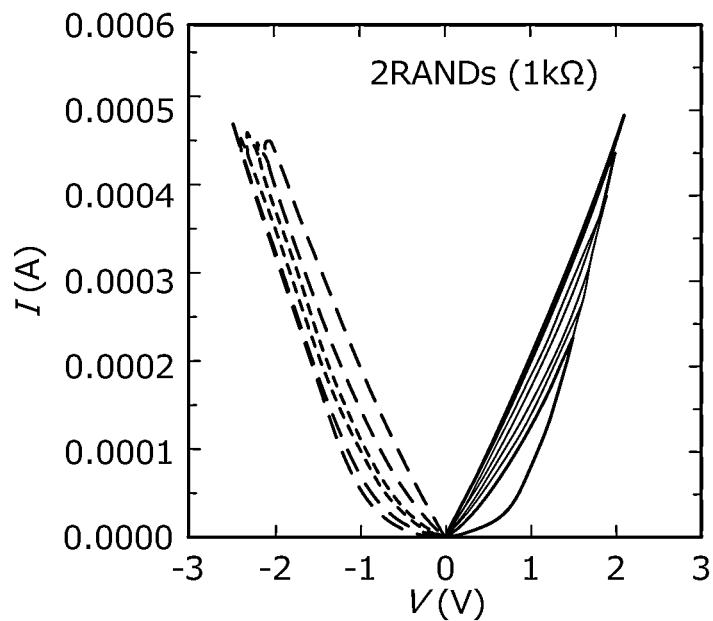
FIG. 7A is a diagram showing I-V characteristics in an instance in which voltage applied to RAND1+RAND2 according to the embodiment is varied.
Figure 7B:
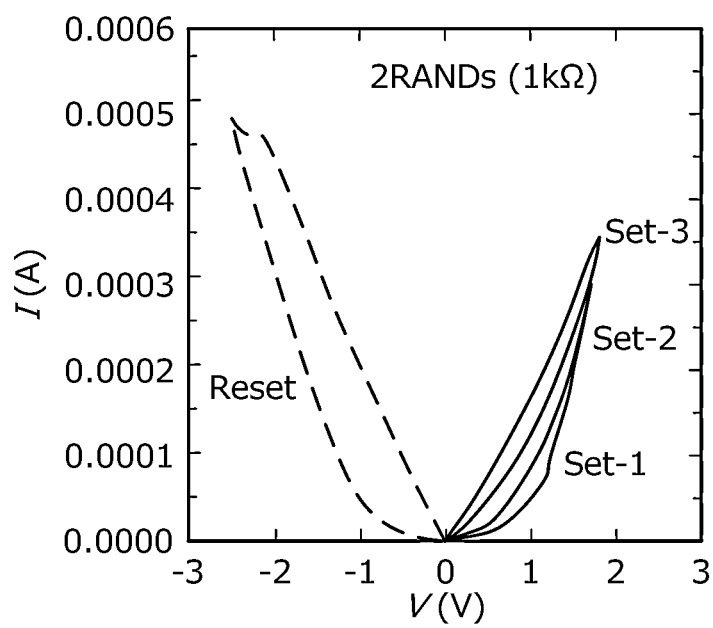
FIG. 7B is a diagram showing I-V characteristics in an instance in which voltage applied to RAND1+RAND2 according to the embodiment is varied.
Figure 7C:
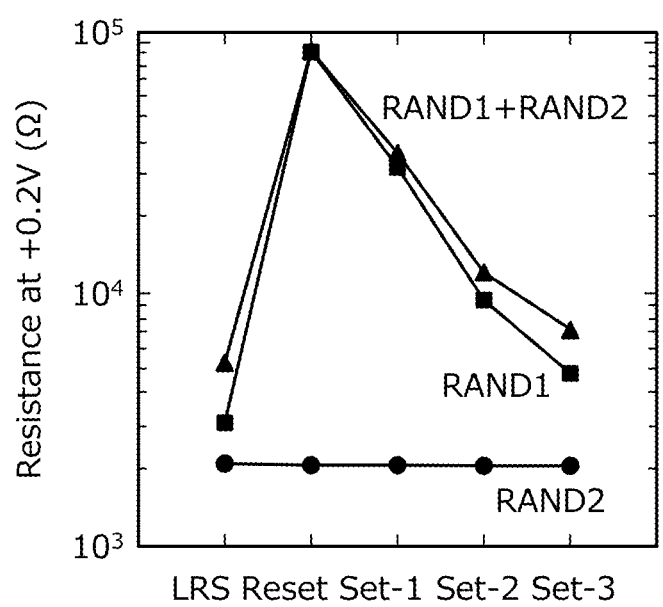
FIG. 7C is a diagram showing I-V characteristics in an instance in which voltage applied to RAND1+RAND2 according to the embodiment is varied.

FIGS. 7A, 7B, and 7C are diagrams showing I-V characteristics in an instance in which the voltage applied to RAND1+RAND2 according to the embodiment is varied. FIG. 7A depicts I-V characteristics in an instance in which a maximum value of the voltage applied to RAND1+RAND2 is varied in 50 mV-steps. Both the Set process (solid lines) and the Reset process (dashed lines) indicate a state in which the resistance changes in an analog-manner according to voltage application conditions. Here, in particular, in the Set process, while multiple characteristics curves are depicted according to the variation of the maximum value of the applied voltage, on all of the characteristics curves, sudden increase of the resistance is suppressed.

FIG. 7B depicts I-V characteristics in an instance in which Set (Set1, Set2, Set3) is performed three times, where the maximum value of the applied voltage is assumed to be +1.5V, +1.7V, and +1.8V, and FIG. 7C depicts variation of the resistances of each of the device elements RAND1, RAND2 during each of the three sessions of Set depicted in FIG. 7B. As depicted in FIG. 7B, in the Set process (solid lines), while three characteristics curves (Set-1, Set-2, Set-3) corresponding to variation of the maximum value of the applied voltage are depicted, all of the characteristics curves have a slow decrease in resistance with respect to voltage and analog characteristics are enhanced. Further, with respect to 0V as a center, the characteristics of the Set process are symmetrical to the characteristics of the Reset process.

Further, regarding changes in the resistance values for RAND1 and RAND2 depicted in FIG. 7C, changes in the resistance value occur only for RAND1, and no change in the resistance value of RAND2 occurs. Thus, it is surmised that analog characteristics in the observed resistance lowering process (the Set process) are not due to competitive changes in the resistance value resulting from connecting RAND1 and RAND2 in reverse (corresponds to FIGS. 2 and 3). Further, in an instance in which a load resistance equivalent to the resistance value of RAND2 is connected to a single RAND, the resistance decreases steeply. These results suggest that there are other factors that contribute to the analog characteristics besides the resistance value of the device element.

Changes in the resistance of a configuration like that of RAND1+RAND2 according to the embodiment are described using the equivalent circuit depicted in FIG. 1. For example, in the resistance lowering process (the Set process), 200 nsec-wide pulses of +1.5V are supplied continually to RAND1+RAND2 and in the resistance increasing process (the Reset process), 200 nsec-wide pulses of −1.5V are supplied continually to RAND1+RAND2.

The Set process is rapid and therefore, for an instance of alternating current of $\omega>0$, $I=V/Z$, $V_{TE1}-V_{ME}=I\times Z_1$, and $V_{ME}-V_{TE2}=I\times Z_2$ are true, where, $Z$ is the impedance of RAND1, RAND2; and $Z_1=1/((1/R_1)+j\omega C_1)$ and $Z_2=1/((1/R_2)+j\omega C_2)$ are true, (jω being a differential operator). Thus, a ratio of the voltage of the two RANDs (RAND1, RAND2) is expressed as:

$$(V_{TE1}-V_{ME})/(V_{ME}-V_{TE2})=Z_1/Z_2=(1/((1/R_1)+j\omega C_1)))/ (1/((1/R_2)+j\omega C_2)))=((1/R_2+j\omega C_2))/((1/R_1)+ j\omega C_1).$$

In an instance in which RAND1 is in a high resistance state (HRS) and RAND2 is in a low resistance state (LRS), before Set begins, when $\omega=0$, $R_1 \gg R_2$ is satisfied. Here, $V_{TE1}-V_{ME} \gg V_{ME}-V_{TE2}$ is satisfied, and voltage is applied to RAND1 in a HRS.

When Set begins, an instance in which $\omega \to \infty$ is approached and when RAND1 and RAND2 have the same structure and $C_1=C_2$ is set, $V_{TE1}-V_{ME}=V_{ME}-V_{TE2}$ is true in the Set process and during Set, the voltage applied to RAND1 decreases and sudden resistance changes are suppressed. In a case of a rapid response, $C_2/C_1$ has to be reduced to reduce $(V_{TE1}-V_{ME})/(V_{ME}-V_{TE2})$ and therefore, by setting $C_2$ to be smaller than $C_1$, the voltage distributed to RAND1 decreases.

As described above, during DC operation (changes in the resistance are slow), $V_{TE1}-V_{ME}:V_{ME}-V_{TE2}=R_1:R_2$ is true and therefore, when $R_1>R_2$ is satisfied, $V_{TE1}-V_{ME}>V_{ME}-V_{TE2}$ is satisfied. Further, during rapid operation (changes in the resistance are rapid), $V_{TE1}-V_{ME}:V_{ME}-V_{TE2}=(1/C_1):(1/C_2)$ is true and therefore, even when $R_1>R_2$ is satisfied, if $C_1=C_2$ is true, then, $V_{TE1}-V_{ME}=V_{ME}-V_{TE2}$ is true. As a result, normally, while a large portion of the voltage is distributed to a device element of a high resistance state, when the resistance rapidly decreases, the voltage is reduced, enabling sudden decreases in the resistance to be suppressed.

Figure 8:
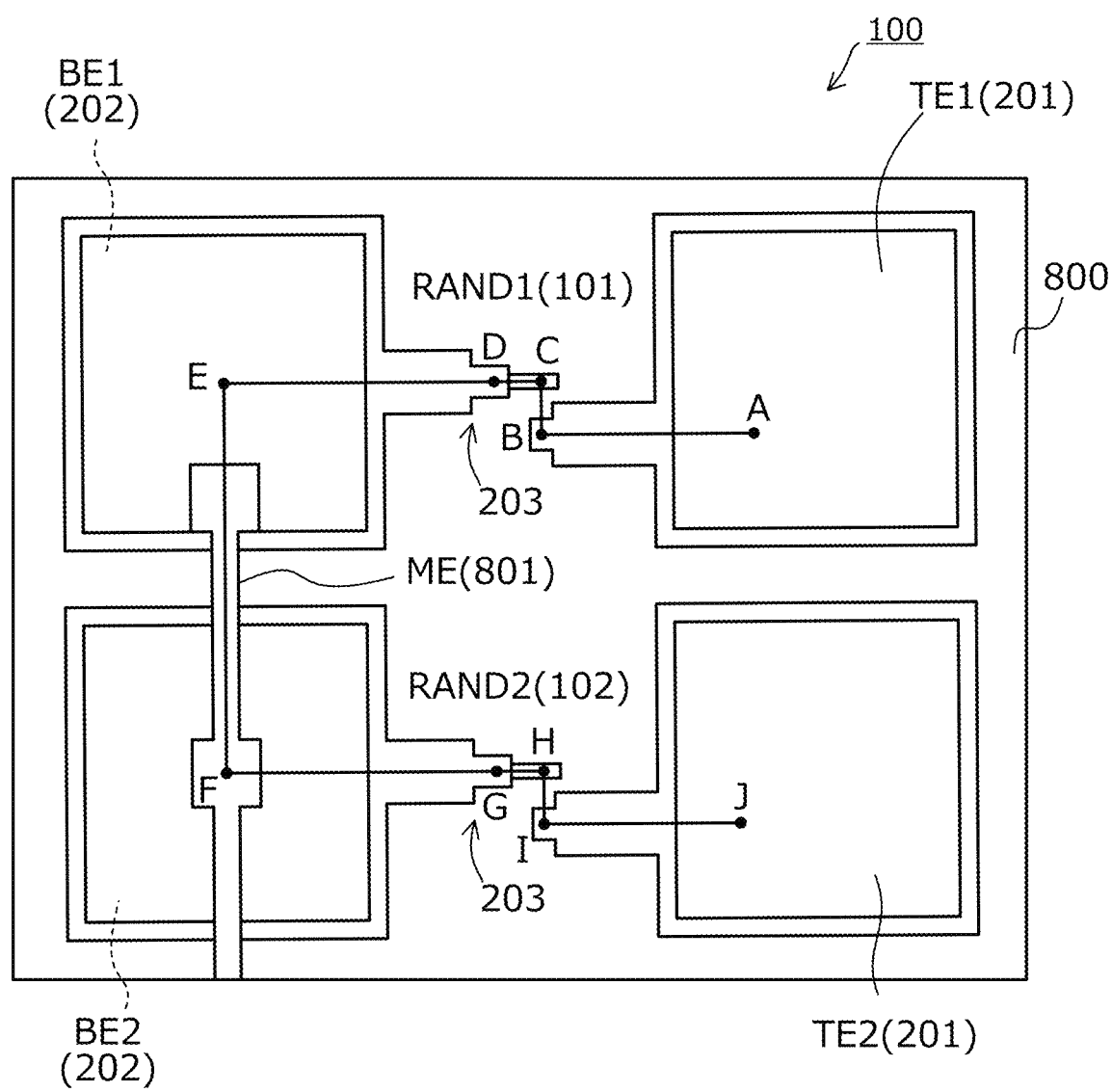
FIG. 8 is a plan view of RAND1+RAND2 according to the embodiment
Figure 9:
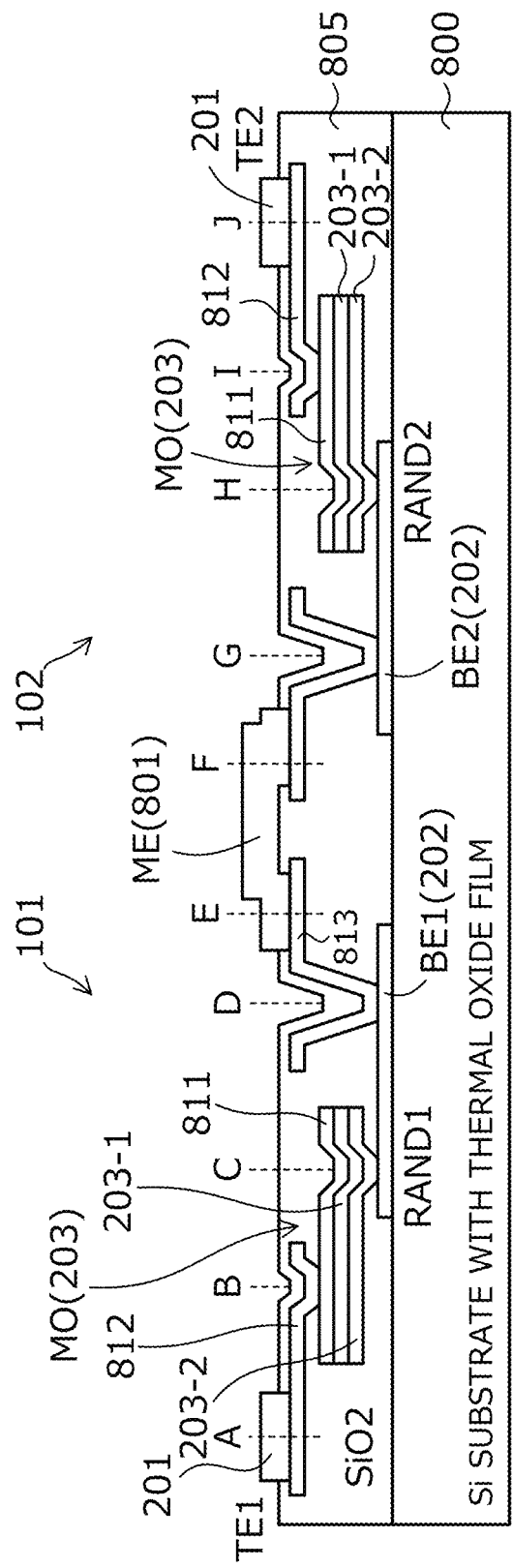
FIG. 9 is a cross-sectional view along cutting lines connecting points A to J depicted in FIG. 8.

Next, an example of the structure of the resistive analog neuromorphic device element is described with reference to FIGS. 8 to 10. FIG. 8 is a plan view of RAND1+RAND2 according to the embodiment; FIG. 9 is a cross-sectional view along cutting lines connecting points A to J depicted in FIG. 8. FIGS. 8 and 9 correspond to a specific structural example of the schematic diagram depicted in FIG. 2.

When viewed from the perspective of the plan view depicted in FIG. 8, the resistive analog neuromorphic device element 100 has RAND1 (101) and RAND2 (102) disposed adjacently to each other on a Si substrate 800. A driving voltage is applied to TE1 (201) of RAND1 (101).

The oxide layer (MO) 203 is provided between TE1 (201) and BE1 (202) of RAND1 (101). The MO 203 of RAND1

(101) is positioned between points B and C depicted in FIG. 8. BE1 (202) of RAND1 (101) is connected conductively to BE2 (202) of RAND2 (102) via an ME 801.

The oxide layer (MO) 203 is provided between BE2 (202) and TE2 (201) of RAND2 (102). The MO 203 of RAND2 (102) is positioned between points H and I depicted in FIG. 8. TE2 (201) of RAND2 (102) is connected to a ground (GND).

As depicted in the cross-sectional view depicted in FIG. 9, in the stacked structure of RAND1 (101), BE1 (202) of RAND1 (101) is provided on the Si substrate 800. The two layers (the MO1 (the TaOx-L) 203-1 and the MO2 (the TaOx-H) 203-2) depicted in FIG. 2 and having different resistivities are provided on BE1 (202), as the MO 203. An insulating film 805 such as a silicon oxide ($SiO_2$) is provided on the Si substrate 800, the insulating film 805 covering TE1, BE1, and the MO.

The two layers (the MO 203-1, 203-2) depicted in FIG. 9 have a recessed portion at point C and are joined to BE1 (202). For example, the recessed portion (in a direction from point B to point C) is 100 nm. Further, TE1 (201) has a TiN layer 811 layered on the MO 203-1 between points B and C, and a TiN layer 812 layered between points B and A and connected to TE1 (201). The TiN layer 812 has a recessed portion at point B and is connected to the TiN layer 811.

Further, BE1 (202), at point D, is lead to a front surface position by a TiN layer 813 that is substantially V-shaped and BE1 (202) is connected to the ME (801) at point E.

The stacked structure of RAND2 (102) is disposed symmetrically to RAND1 (101), with respect to the ME (801) as a center.

As a result, as depicted in FIG. 9, the two RANDs (RAND1 (101), RAND2 (102)) form a single circuit system spanning from points A to J. A single existing RAND corresponds to RAND1 and RAND1+RAND2 according to the embodiment (100) may be manufactured simply by providing and connecting the ME 801 between existing RANDs disposed on the Si substrate 800.

A method of manufacturing the resistive analog neuromorphic device element is described. FIGS. 10A, 10B, 10C, 10D, 10E, 10F, 10G, 10H, 10I, 10J, and 10K are cross-sectional views depicting processes of manufacturing the resistive analog neuromorphic device element according to the embodiment. In these figures, for convenience, while the RAND1 (101) portion on the left-hand side of FIG. 9 is depicted, RAND2 (102) on the right-hand side may be fabricated concurrently with RAND1 (101), in a shape symmetrical to that of RAND1 (101).

Figure 10A:
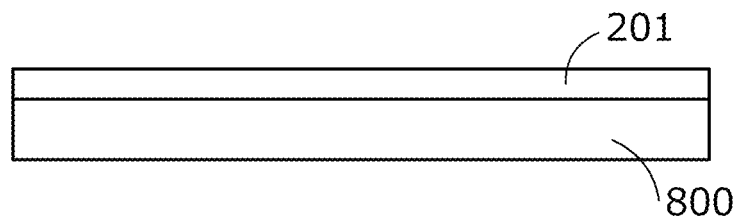
FIG. 10A is a cross-sectional view depicting processes of manufacturing the resistive analog neuromorphic device element according to the embodiment.

First, as depicted in FIG. 10A, on the Si substrate 800 having a thermal oxide film, a TiN film is formed as the lower electrode (BE1) 202. The TiN film, for example, may be formed by reactive sputtering by an $Ar/N_2$ gas, using a Ti target. Other than this, the TiN film may be formed by sputtering that uses a TiN ceramics target, chemical vapor deposition (CVD), atomic layer deposition (ALD), etc. The lower electrode (BE1) 202 is not limited to TiN, and TaN, W, Pt, Ir, etc. may be used.

Figure 10B:
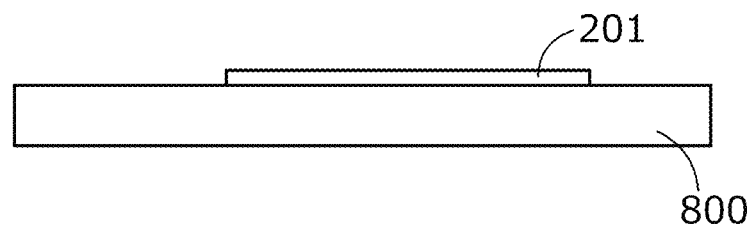
FIG. 10B is a cross-sectional view depicting processes of manufacturing the resistive analog neuromorphic device element according to the embodiment.
Figure 10C:
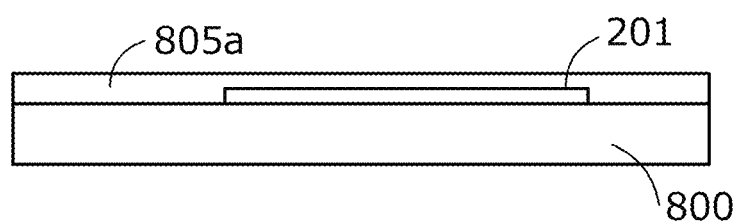
FIG. 10C is a cross-sectional view depicting processes of manufacturing the resistive analog neuromorphic device element according to the embodiment.

Next, as depicted in FIG. 10B, the lower electrode (BE1) 202 is patterned and formed by photolithography and reactive ion etching. Next, as depicted in FIG. 10C, for example, by CVD, an entire area of the front surface including the pattern of the lower electrode (BE1) 202 is covered by an insulating film 805a containing $SiO_2$.

Figure 10D:
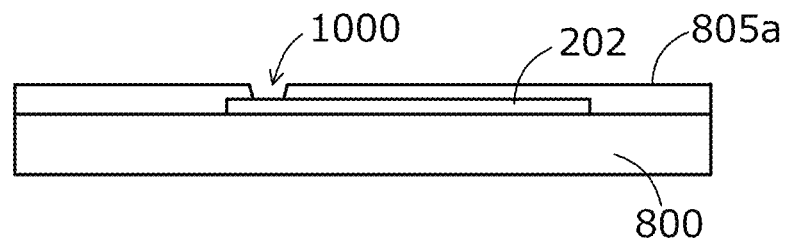
FIG. 10D is a cross-sectional view depicting processes of manufacturing the resistive analog neuromorphic device element according to the embodiment.

Next, as depicted in FIG. 10D, a hole structure 1000 constituting a device element is formed on the insulating film ($SiO_2$) 805a that is on the lower electrode (BE1) 202.

The hole structure 1000 may be formed by performing lithography and etching to the insulating film 805a.

Figure 10E:
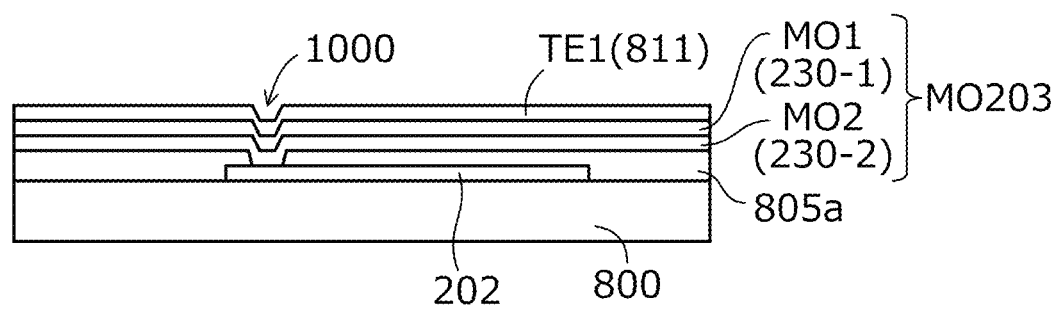
FIG. 10E is a cross-sectional view depicting processes of manufacturing the resistive analog neuromorphic device element according to the embodiment.

Next as depicted in FIG. 10E, on the insulating film 805a on which the hole structure 1000 is formed, two layers (MO1 (203-1), MO2 (203-2)) having different resistivities are deposited as the oxide layer (MO) 203, and the upper electrode layer (TiN layer) 811 constituting a portion of the upper electrode (TE1) is deposited thereon.

Figure 10F:
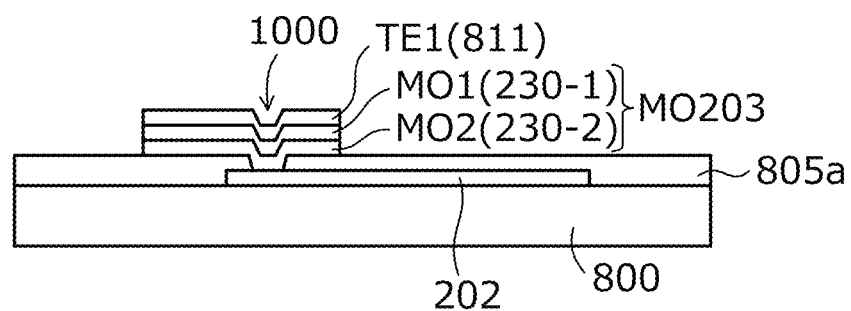
FIG. 10F is a cross-sectional view depicting processes of manufacturing the resistive analog neuromorphic device element according to the embodiment.

Next, as depicted in FIG. 10F, the oxide layer (MO) 203 and the upper electrode layer 811 are patterned and formed by lithography and reactive ion etching.

Figure 10G:
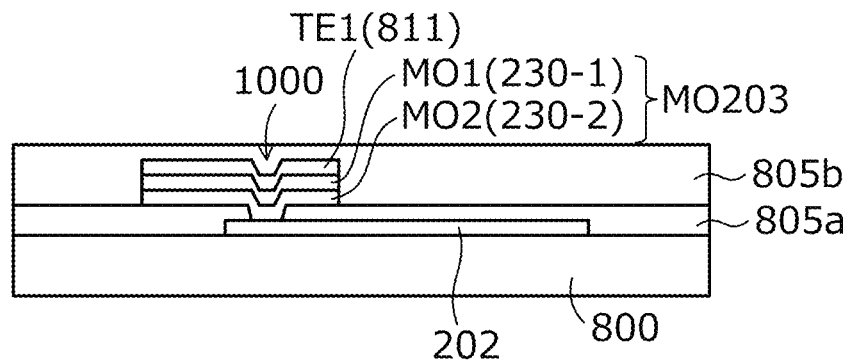
FIG. 10G is a cross-sectional view depicting processes of manufacturing the resistive analog neuromorphic device element according to the embodiment.

Next, as depicted in FIG. 10G, in an entire area of the front surface including the oxide layer (MO) 203 and the upper electrode layer 811 is covered by the insulating film 805b containing $SiO_2$.

Figure 10H:
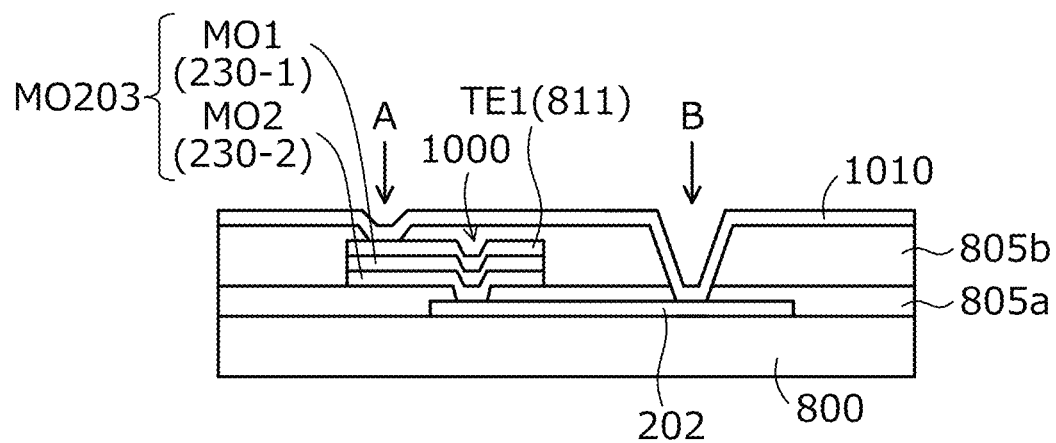
FIG. 10H is a cross-sectional view depicting processes of manufacturing the resistive analog neuromorphic device element according to the embodiment.

Next, as depicted in FIG. 10H, with respect to the insulating film 805b, a portion (area indicated by "A") of the upper electrode layer 811 has a depth reaching the upper electrode layer 811 and a portion (area indicated by "B") of the lower electrode (BE1) 202 has a depth reaching the lower electrode (BE1) 202; and the insulating film 805b is etched. Thereafter, an upper electrode layer (for example, TiN) 1010 is formed.

Figure 10I:
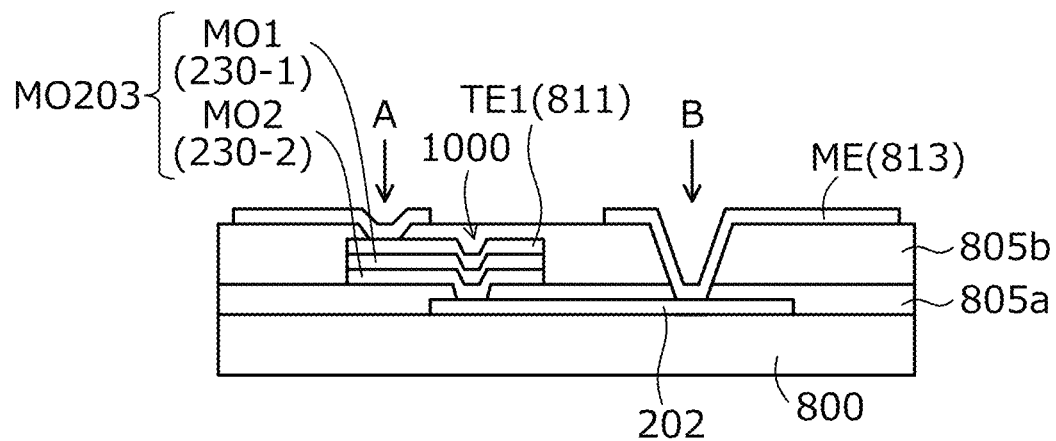
FIG. 10I is a cross-sectional view depicting processes of manufacturing the resistive analog neuromorphic device element according to the embodiment.

Next, as depicted in FIG. 10I, a wiring layer of the upper electrode layer 1010 is patterned by photolithography and reactive ion etching, whereby the upper electrode layer 1010 is divided, and on the side indicated by "A", the TiN layer 812 constituting a portion of the upper electrode (TE1) is formed and on the side indicated by "B", the TiN layer 813 constituting a portion of the junction point (ME) 801 is formed.

Figure 10J:
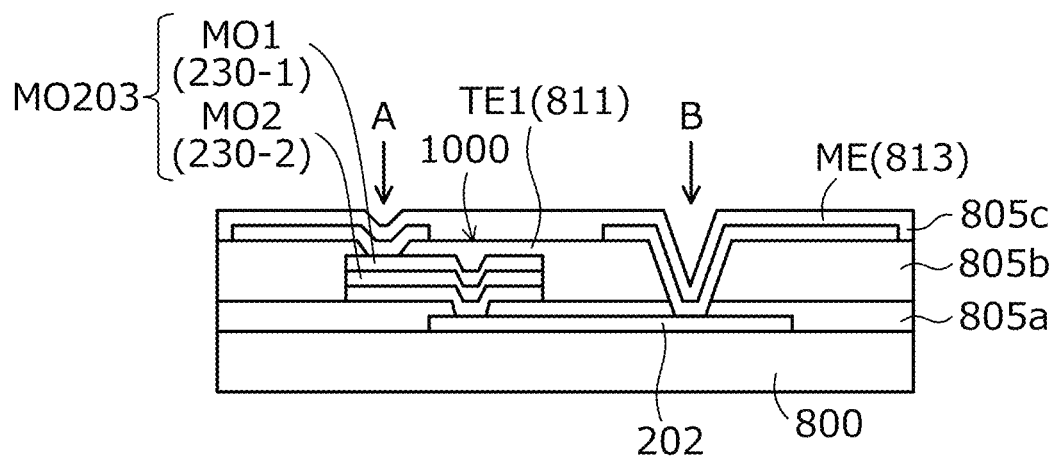
FIG. 10J is a cross-sectional view depicting processes of manufacturing the resistive analog neuromorphic device element according to the embodiment.

Next, as depicted in FIG. 10J, an entire are of the front surface including the TiN layers 812, 813 is covered by the insulating film 805c containing $SiO_2$.

Figure 10K:
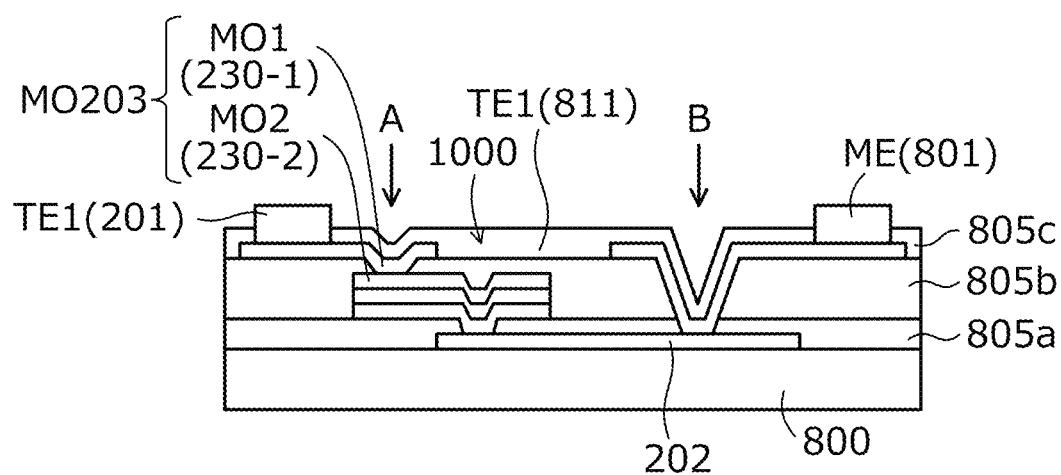
FIG. 10K is a cross-sectional view depicting processes of manufacturing the resistive analog neuromorphic device element according to the embodiment.

Next, as depicted in FIG. 10K, a contact electrode 201 constituting a portion of the upper electrode (TE1) and in contact with the TiN layer 812 portion is formed, and a contact electrode constituting a portion of the ME (801) and in contact with the TiN layer 813 portion is formed. The contact electrodes 201, 801 (ME) may be formed containing a compound of Au and Ti, or Al, etc.

By the processes described above, one of the RANDs (RAND1 (101)) may be formed. As depicted in FIG. 9, RAND2 (102) is disposed symmetrically to RAND1 (101), with the ME (801) portion as a center and in the processes described above, RAND1 (101) and RAND2 (102) may formed concurrently on the Si substrate 800. The formed RAND1 (101) and RAND2 (102) have a structure in which the lower electrodes BE1 and BE2 (202) are connected to each other at the ME (801) portion.

Figure 11:
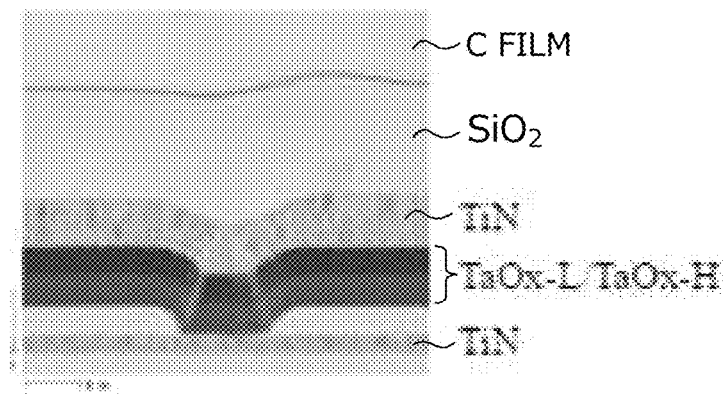
FIG. 11 is a figure showing a cross-sectional TEM image in which an oxide layer portion depicted in FIG. 9 is enlarged.

FIG. 11 is a figure showing a cross-sectional TEM image in which the oxide layer portion depicted in FIG. 9 is enlarged. FIG. 11 depicts an image captured by a transmission electron microscope (TEM); the oxide layer (203) at portions near points C and H in FIGS. 8 and 9 are depicted enlarged. On the TiN layer that corresponds to BD, BE2 (202), two layers (the MO1 (the TaOx-L) 203-1, and the MO2 (the TaOx-H) 203-2) are stacked as the oxide layer (MO) 203.

While the oxide layer (MO) 203 may be suitably selected to obtain a desired resistance value, for example, the oxide layer (MO) 203 is in a range of 20 nm to 40 nm. A TiN layer that corresponds to TE1, TE2 (201) is stacked on the MO 203 and thereon, the insulating film 805 ($SiO_2$) and a protective carbon film (C film) are formed.

In an instance in which the resistive analog neuromorphic device element 100 is bonded to the lower electrode BE (202) by the hole structure 1000 described above, the oxide layer (MO) 203 greatly sets the resistivity of Ta oxide film on the lower electrode (BE) 202 side.

On the other hand, in a structure of the oxide layer (MO) 203 without the hole structure 1000, for example, the structure depicted in FIGS. 2 and 3, the oxide layer (MO) 203 has a structure in which the area of the upper electrode TE (201) and the area of the interface with the lower electrode (BE) 202 are the same.

Figure 12:
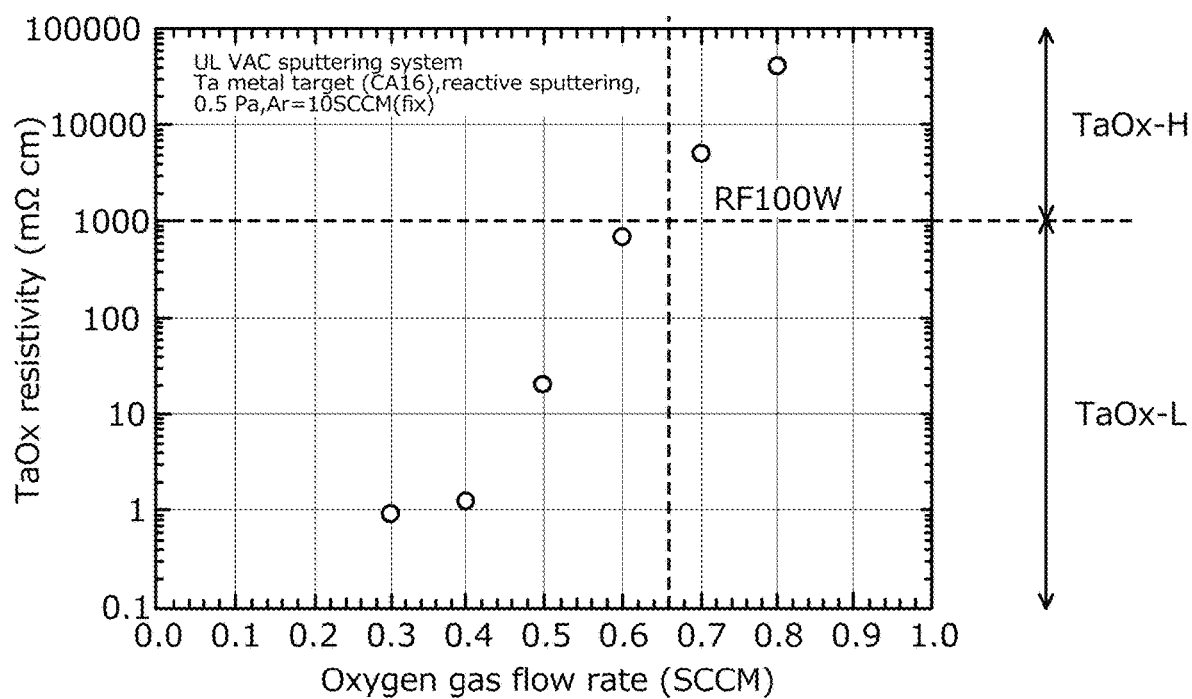
FIG. 12 is a chart for explaining a setting example for the resistivity of multiple oxide layers of the embodiment.
Figure 14:
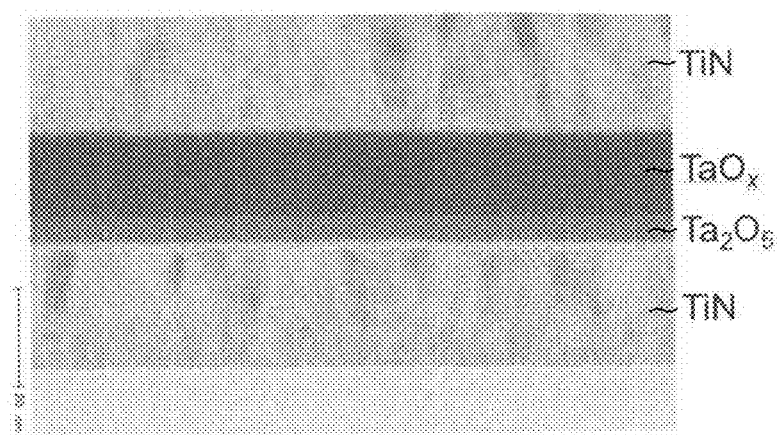
FIG. 14 is a figure showing a cross-sectional TEM image in an instance in which "x" of the oxide layer of the embodiment is 2.5.

FIG. 12 is a chart for explaining a setting example for the resistivity of multiple oxide layers of the embodiment. A horizontal axis indicates SCCM, a vertical axis indicates the resistivity of each layer of TaOx, and a setting example in an instance in which RF power is 100 W is depicted. In FIG. 14, the oxide layer (the TaOx-L) for which resistivity is low sets x<2 from FIG. 12. In other words, in the structure of the oxide layer (MO) 203 without the hole structure 1000 depicted in FIGS. 2 and 3, based on FIG. 14, it suffices to set either the oxide layer MO1 (203-1) or the oxide layer MO2 to at least 1000 mOhm(mΩ) cm and to set the other to less than 1000 mOhm cm. Further, either the oxide layer MO1 (203-1) or the oxide layer MO2 may be disposed as the upper layer or the lower layer.

Figure 13A:
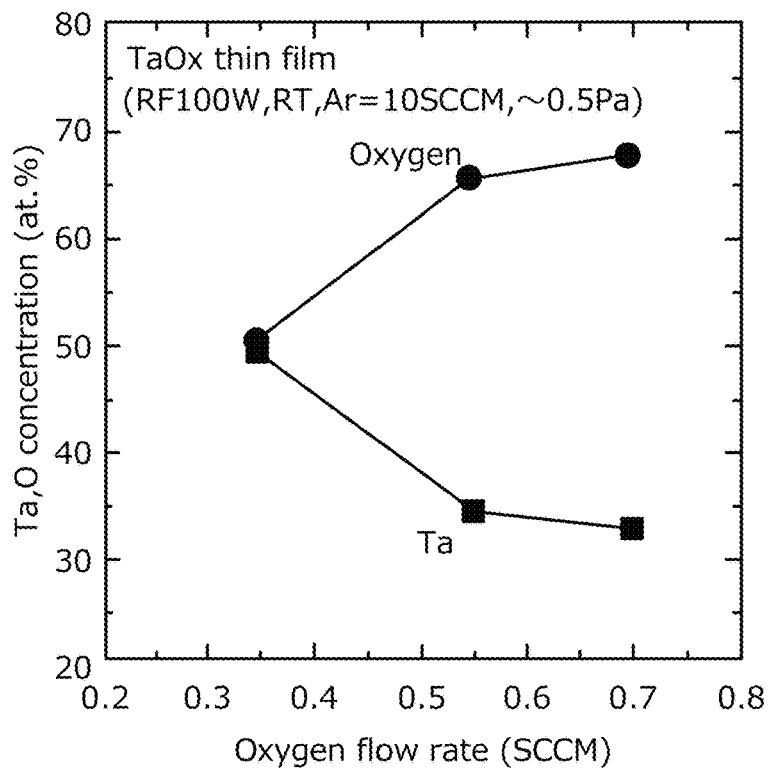
FIG. 13A is a chart for describing a composition analysis example of the oxide layer of the embodiment.
Figure 13B:
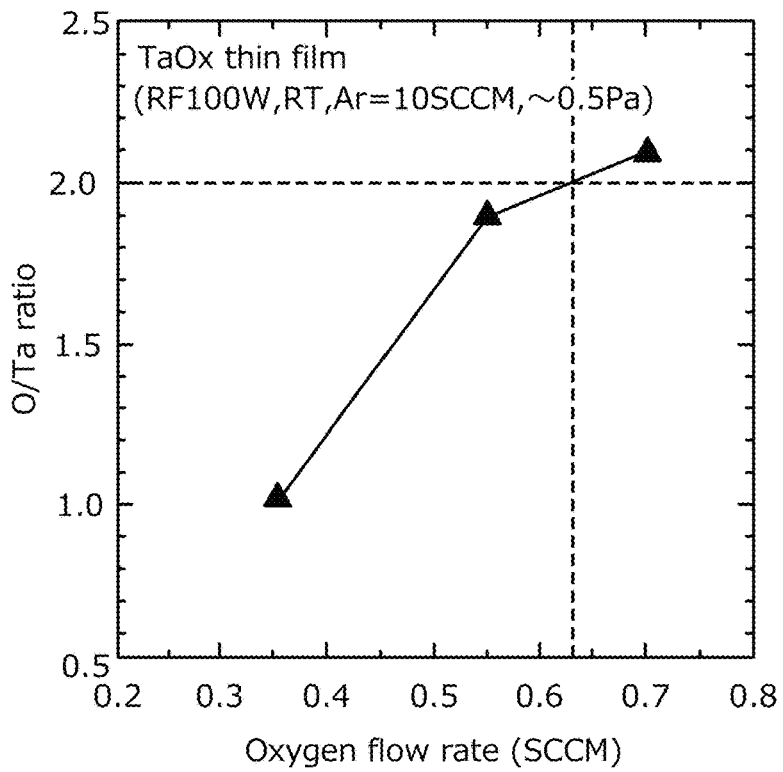
FIG. 13B is a chart for describing a composition analysis example of the oxide layer of the embodiment.

FIGS. 13A and 13B are charts for describing a composition analysis example of the oxide layer of the embodiment. In FIG. 13A, a horizontal axis indicates standard cubic centimeters per minute (SCCM) and a vertical axis indicates tantalum (Ta) concentration and oxygen O (oxygen) concentration. In FIG. 13B, a horizontal axis indicates SCCM, and a vertical axis indicates the O/Ta ratio.

From the composition analysis depicted in FIGS. 13A and 13B, the higher is the resistivity of the oxide layer (MO) 203, "x" of TaOx tends to increase and film thickness may be reduced. For example, of MO1 (203-1) and MO2 (203-2), the oxide layer (the TaOx-H) having the higher resistivity may have a film thickness set in a range of 20 nm to 40 nm in an instance in which "x" of TaOx is in a range of 2 to 2.2, and the film thickness may be set in a range of 3 nm to 10 nm in an instance in which "x" of TaOx exceeds 2.2. On the other hand, for the oxide layer (the TaOx-L) having the lower resistivity, "x" of TaOx is less than 2.

FIG. 14 is a figure showing a cross-sectional TEM image in an instance in which "x" of the oxide layer of the embodiment is 2.5. In this manner, even in an instance in which "x" of TaOx exceeds 2.2, by setting the oxide layer MO1=$Ta_2O_5$ (x=2.5) and the oxide layer MO2=TaOx (x<2), the resistivity satisfies MO1>MO2.

The oxide layer (MO) 203 is deposited by the reactive sputtering described above and thereafter, is exposed to an oxygen atmosphere. For example, the Si substrate 800 is exposed to the atmosphere for a predetermined time or longer. Other than this, an annealing process of heating the substrate to a range of 100 degrees C. to 300 degrees C. may be performed in a state assisted by radicals generated by applying RF power to an argon gas containing oxygen. Further, for the oxide layer (MO) 203, of the MO1 (203-1) and MO2 (203-2), the one having a greater amount of oxygen suffices to have "x" set to more than 2.

In the configuration example described above, while a pair of electrodes TE (201), BE (202) are assumed to contain TiN and the oxide layer (MO) 203 is assumed to contain TaOx, configuration is not limited hereto. For example, the electrodes TE, BE may be suitably set from among metals Pt, Au, Cu, TiAlN, TaN, W, Ir, and Ru; for the oxide layer MO as well, other than TiOx, a dielectric of HfOx, AlOx, SiOx, WOx, ZrOx and compounds thereof, or an oxynitride or oxide of the electrode may be selected.

As described above, according to the present embodiment, features include having a resistive analog neuromorphic device element constituted by a pair of electrodes and an oxide layer provided between the pair of electrodes, and a parallel circuit having a low resistance component and a capacitance component, where the parallel circuit is connected in series to the resistive analog neuromorphic device element. As a result, in the Set process (the resistance lowering process), the voltage is reduced by being distributed according to the ratio of the capacitances, and sudden decreases in the resistance may be suppressed.

Further, as the parallel circuit, a resistive analog neuromorphic device element having a capacitance component is used and a pair of resistive analog neuromorphic device elements are connected in series, whereby the resistive analog neuromorphic device elements are used as device elements for which the resistance value is variable. As a result, simple manufacturing using existing resistive analog neuromorphic device elements is possible and it becomes possible to obtain desired resistance-change characteristics. The capacitance of the device elements with variable resistance and having a capacitance component may be a constant capacitance or may be configured to be varied electrically.

Further, configuration may be such that the electrodes are constituted by an upper electrode and a lower electrode and an oxide layer is provided between the upper electrode and the lower electrode, whereby a single resistive analog neuromorphic device element in which a low resistance component and a capacitance component are connected in parallel is configured, the lower electrodes of two of the resistive analog neuromorphic device elements are connected, and voltage is applied to a circuit system spanning from the upper electrode of one of the resistive analog neuromorphic device elements to the upper electrode of another resistive analog neuromorphic device element, whereby resistance value is variable. As a result, of multiple memristors on the substrate, it becomes possible to obtain an arbitrary resistance value for each set of resistive analog neuromorphic device elements.

Further, the oxide layer may be configured by stacked layers of differing resistivities. Further, one of the oxide layers may have a resistivity that is less than 1000 mOhm cm while another may have a resistivity of at least 1000 mOhm cm. Providing multiple oxide layers of differing resistivities enables desired resistance-change characteristics to be obtained.

Further, of resistive analog neuromorphic device elements provided at different planar positions on the substrate, an adjacent pair of lower electrodes may be connected. For example, in the structure of an existing memristor in which multiple RANDs are disposed adjacently on the substrate, as depicted by RAND1+RAND2, a pair of adjacent RANDs may be connected in series. Of the RANDs configuring multiple memristors on the substrate, an arbitrary RAND may be used as a memcapacitor device element (resistive analog neuromorphic device element) having the structure of RAND1+RAND2 described in the embodiment, and it becomes possible to obtain an arbitrary resistance value for each set of RAND1+RAND2.

Further, at a single planar position on the substrate, as the resistive analog neuromorphic device element, the lower electrode, the oxide layer, an intermediate electrode, the oxide layer, and the upper electrode may be stacked sequentially in stated order from a lowermost component. As a result, a single set configuration constituted by a pair of resistive analog neuromorphic device elements on a single planar position on the substrate may be disposed and the resistive analog neuromorphic device element may be efficiently disposed on the substrate.

In the foregoing, according to the present embodiment, sudden decreases in the resistance when the resistance is lowered may be suppressed and therefore, in the Set process, an arbitrary resistance value may be easily obtained. Further, configuration may be such that a parallel circuit having a low resistance component and a capacitance component, or another analog resistive device element is directly connected to the analog resistive device element in which a low resistance component and a capacitance component are connected directly; for all of the configurations, the structure is simple and manufacturing may be easily performed. In particular, in a configuration in which two device elements with variable resistance are connected in series, an existing device element with variable resistance is used, enabling manufacturing to be performed simply.

Further, according to the present embodiment, the analog resistive device element has a structure in which an oxide layer is sandwiched between a pair of electrodes, and when viewed in a stacked layer direction, the structure is a simple one in which the layers are simply stacked on each other. As a result, the height may be reduced, the device element overall may be reduced in size (miniaturized), and three-dimensional structuring of the device element may be performed easily. Three dimensional structuring, for example, is a structure in which the structure depicted in FIG. 2 is a stacked structure as depicted in FIG. 3. According to the embodiment, the structure of each analog resistive device element may be reduced in size and therefore, even in an instance of three dimensional structuring, the size of the device element overall may be kept small.

Further, sudden resistance changes in the resistance lowering process of the resistive analog neuromorphic device element used in the neuromorphic information processing device are suppressed, whereby changes in the resistance become smooth by removing the noise of resistance change components while reduced power consumption and a high speed of a sum of products circuit may be facilitated. Furthermore, by suppressing sudden resistance changes in the resistance lowering process, resistance-change characteristics in the resistance lowering process and the resistance-change characteristics in the resistance increasing process may be caused to be symmetrical to each other. By using the resistive analog neuromorphic device element in a sum of products circuit (artificial intelligence, deep learning, inference, machine learning, etc.) of the neuromorphic information processing device, the symmetry of the memory operation and the forgetting operation of a sum of products circuit may be enhanced.

As described above, another analog resistive device element, or the parallel circuit that has a low resistance component and a capacitance component is connected directly to the analog resistive device element that has a low resistance component and a capacitance component connected in parallel. For example, between a pair of analog resistive device elements, in state in which the resistance has not changed (before a change in resistance occurs), voltage is distributed at the ratio of the low resistance components R1 and R2. During a rapid change in the resistance, effects of the capacitance components C1, C2 of the two analog resistive device elements appear and the voltage becomes distributed according to the ratio of the capacitances. As a result, normally, a large portion of the voltage is distributed to the device element of a high resistance state; however, when the resistance rapidly decreases, the voltage is reduced, thereby suppressing sudden decreases in the resistance.

The present invention achieves an effect in that sudden resistance changes may be suppressed while an arbitrary resistance value and size reductions are possible by a simple structure.

The present invention may use an existing memristor structure as a memcapacitor device element and is useful for technologies related to neuromorphic information processing devices.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An information processing device, comprising:
   a first resistive analog neuromorphic device element, having:
      a pair of electrodes, and
      an oxide layer provided between the pair of electrodes, the oxide layer including a plurality of stacked layers of differing resistivities; and
   a second resistive analog neuromorphic device element, having:
      a low resistance component, and
      a capacitance component, wherein
   the first and second resistive analog neuromorphic device elements are connected in series to form a device element having a resistance value that is variable.

2. The information processing device according to claim 1, wherein
   the pair of electrodes in the first resistive analog neuromorphic device element includes an upper electrode and a lower electrode,
   the second resistive analog neuromorphic device element includes an upper electrode, a lower electrode and an oxide layer provided therebetween,
   the upper electrode, the lower electrode, and the oxide layer in the second resistive analog neuromorphic device element configuring a single resistive analog neuromorphic device element in which the low resistance component and the capacitance component are connected in parallel, and
   the lower electrodes of the first and second resistive analog neuromorphic device elements are connected, so as to form a circuit system from the upper electrode of the first resistive analog neuromorphic device element to the upper electrode of the second resistive analog neuromorphic device element.

3. The information processing device according to claim 1, wherein
   a resistivity of one of the plurality of stacked layers is less than 1000 mOhm cm, and
   a resistivity of another of the plurality of stacked layers is at least 1000 mOhm cm.

4. The information processing device according to claim 1, further comprising:
   a plurality of resistive analog neuromorphic device elements, including the first and second resistive analog neuromorphic device elements, that are provided at different planar positions on a substrate, and
   each of the plurality of resistive analog neuromorphic device elements has a lower electrode, and a pair of the lower electrodes that are adjacent to each other are connected to each other.

5. The information processing device according to claim 2, further comprising a substrate, wherein
sequentially from the substrate, the lower electrode, the oxide layer, an intermediate electrode, the oxide layer, and the upper electrode are stacked at a single planar position on the substrate, as the first resistive analog neuromorphic device element.

6. A method of driving an information processing device having a first resistive analog neuromorphic device element that has a pair of electrodes and an oxide layer provided between the pair of electrodes, the oxide layer including a plurality of stacked layers of differing resistivities, the method comprising:
connecting a second resistive analog neuromorphic device element in series to the first resistive analog neuromorphic device element, the second resistive analog neuromorphic device element having a low resistance component and a capacitance component; and
applying a voltage to thereby provide a variable resistance value.

* * * * *